(12) United States Patent
Wang et al.

(10) Patent No.: US 12,069,888 B2
(45) Date of Patent: Aug. 20, 2024

(54) ORGANIC LIGHT EMITTING DISPLAY SUBSTRATE AND MANUFACTURING METHOD THEREOF, AND ORGANIC LIGHT EMITTING DISPLAY PANEL

(71) Applicant: BOE TECHNOLOGY GROUP CO., LTD., Beijing (CN)

(72) Inventors: Feng Wang, Beijing (CN); Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 17/599,039

(22) PCT Filed: Feb. 22, 2021

(86) PCT No.: PCT/CN2021/077259
§ 371 (c)(1),
(2) Date: Sep. 28, 2021

(87) PCT Pub. No.: WO2021/169920
PCT Pub. Date: Sep. 2, 2021

(65) Prior Publication Data
US 2022/0181586 A1    Jun. 9, 2022

(30) Foreign Application Priority Data
Feb. 26, 2020    (CN) .................. 202010118453.X (51) Int. Cl.
*H10K 50/852*    (2023.01)
*H10K 50/14*    (2023.01)
(Continued)

(52) U.S. Cl.
CPC .......... *H10K 50/852* (2023.02); *H10K 50/14* (2023.02); *H10K 50/17* (2023.02); *H10K 71/00* (2023.02)

(58) Field of Classification Search
CPC ...... H10K 50/852; H10K 50/14; H10K 50/17; H10K 71/00; H10K 2102/331;
(Continued)

(56) References Cited

U.S. PATENT DOCUMENTS 9,853,249 B2 * 12/2017 Chung ................. G02F 1/1339
10,714,710 B2 * 7/2020 Woo ....................... H10K 85/10
(Continued)

FOREIGN PATENT DOCUMENTS

CN    105280682 A    1/2016
CN    108615752 A    10/2018
(Continued)

OTHER PUBLICATIONS

China Patent Office, First Office Action dated Apr. 25, 2022, for corresponding Chinese application 202010118453.X.

*Primary Examiner* — Caleb E Henry
(74) *Attorney, Agent, or Firm* — HOUTTEMAN LAW LLC (57) ABSTRACT

An organic light emitting display substrate includes: a base substrate; organic light emitting diodes disposed on the base substrate, with each organic light emitting diode including a first electrode layer, an organic light emitting layer and a second electrode layer, and the first electrode layer and the second electrode layer forming an optical resonant cavity; and a nanoparticle layer on a side of the organic light emitting diodes away from the base substrate and includes nanoparticle patterns, each nanoparticle pattern is disposed on a side of a second electrode layer of a corresponding one of the plurality of organic light emitting diodes away from an organic light emitting layer and at least partially covers the second electrode layer. Resonance mode of the nanoparticle pattern is coupled with a resonance mode of an optical
(Continued)

resonant cavity of the corresponding organic light emitting diode to form a Fano resonance.

20 Claims, 4 Drawing Sheets

(51) Int. Cl.
*H10K 50/17* (2023.01)
*H10K 71/00* (2023.01)

(58) Field of Classification Search
CPC ...... H10K 50/86; H10K 50/805; H10K 59/12; H10K 50/844; H10K 50/16; H10K 50/171; H10K 50/858; H10K 59/124; H10K 59/123; H10K 59/131; H10K 59/65; H10K 59/122; H10K 50/84; H10K 30/865; H10K 59/00; H10K 50/85; G09G 3/3208; H01L 51/5253; H01L 51/5072; H01L 51/5092; H01L 51/56; H01L 27/3248; H01L 27/3276; H01L 27/3234; H01L 27/3258; H01L 51/5275; H01L 27/3246; H01L 51/5237; H01L 51/5262; H01L 27/3225; H01L 27/3244; H01L 51/5008
See application file for complete search history.

(56) References Cited

U.S. PATENT DOCUMENTS

| | | | | |
|---|---|---|---|---|
| 10,739,390 B2* | 8/2020 | Claussen | ............ | G01R 29/0871 |
| 11,271,053 B2* | 3/2022 | Liang | ................ | H10K 59/1216 |
| 11,747,279 B2* | 9/2023 | Mazed | ................ | G01N 21/658 |
| | | | | 385/14 |
| 2007/0195240 A1* | 8/2007 | Han | ................... | G02F 1/133553 |
| | | | | 349/114 |
| 2012/0211754 A1 | 8/2012 | Park | | |
| 2015/0194634 A1* | 7/2015 | Kang | ................... | H10K 59/122 |
| | | | | 257/40 |
| 2015/0303242 A1* | 10/2015 | Dai | ....................... | H10K 59/123 |
| | | | | 438/23 |
| 2016/0111666 A1* | 4/2016 | Jung | .................... | H10K 77/111 |
| | | | | 438/23 |
| 2016/0126499 A1* | 5/2016 | Dai | ........................ | H10K 59/35 |
| | | | | 257/40 |
| 2016/0349594 A1* | 12/2016 | Wurtz | ................. | G02B 26/001 |
| 2017/0025641 A1* | 1/2017 | Zhang | ................. | H10K 59/876 |
| 2019/0044084 A1* | 2/2019 | O'Carroll | ............ | H10K 50/171 |
| 2019/0103576 A1* | 4/2019 | Okada | ................... | H10K 50/00 |
| 2019/0393449 A1* | 12/2019 | Bai | ........................ | H10K 59/12 |
| 2020/0144547 A1 | 5/2020 | Wan et al. | | |
| 2020/0176519 A1* | 6/2020 | Seo | ........................ | H10K 59/121 |
| 2020/0273927 A1* | 8/2020 | Oh | ......................... | H10K 59/121 |
| 2020/0286964 A1* | 9/2020 | Cho | ....................... | H10K 59/65 |
| 2020/0343321 A1* | 10/2020 | Kim | ...................... | H10K 30/82 |
| 2020/0365674 A1* | 11/2020 | Jeon | .................... | H10K 59/1201 |
| 2020/0395428 A1* | 12/2020 | Baek | .................... | H10K 59/131 |

FOREIGN PATENT DOCUMENTS

| | | |
|---|---|---|
| CN | 108831981 A | 11/2018 |
| CN | 109802050 A | 5/2019 |
| CN | 110518152 A | 11/2019 |
| CN | 111293233 A | 6/2020 |

* cited by examiner

Fig. 4 wavelength (nm)

Fig. 5 radiation intensity wavelength (nm)

ORGANIC LIGHT EMITTING DISPLAY SUBSTRATE AND MANUFACTURING METHOD THEREOF, AND ORGANIC LIGHT EMITTING DISPLAY PANEL

CROSS-REFERENCE TO RELATED APPLICATIONS

The present disclosure claims the priority to the Chinese Patent Application No. 202010118453.X filed with the CNIPA on Feb. 26, 2020, the entire content of which is incorporated herein by reference.

TECHNICAL FIELD

The present disclosure belongs to the field of display technology, and particularly relates to an organic light emitting display substrate, a manufacturing method of the organic light emitting display substrate, and an organic light emitting display panel.

BACKGROUND

Most existing organic light emitting display panels emit light through a resonance effect of optical microcavity, that is, an anode layer, a light emitting layer and a cathode layer of an organic light emitting diode (OLED) forms an optical resonant cavity to enable light with a specific wavelength to be emitted from the cathode layer, so as to realize light emission of each pixel.

However, as requirements for light extraction efficiency of organic light emitting display panels in the market are becoming higher and higher, the light extraction efficiency of organic light emitting display panels needs to be increased.

SUMMARY

In one aspect, the present disclosure provides an organic light emitting display substrate, including: a base substrate; a plurality of OLEDs disposed on the base substrate, with each OLED including a first electrode layer, an organic light emitting layer and a second electrode layer, which are sequentially arranged in a direction away from the base substrate, and the first electrode layer and the second electrode layer forming an optical resonant cavity; and a nanoparticle layer disposed on a side of the plurality of OLEDs away from the base substrate and includes a plurality of nanoparticle patterns, each nanoparticle pattern is disposed on a side of a second electrode layer of a corresponding one of the plurality of OLEDs away from an organic light emitting layer and at least partially covers the second electrode layer, and a resonance mode of the nanoparticle pattern is coupled with a resonance mode of an optical resonant cavity of the corresponding OLED to form a Fano resonance.

In some embodiments, the organic light emitting display substrate further includes a dielectric film layer, which is disposed between the nanoparticle layer and the second electrode layers of the plurality of OLEDs, so as to allow the nanoparticle layer and the second electrode layers to form optical nano resonant cavities for absorbing at least part of ambient light.

In some embodiments, for each nanoparticle pattern and a corresponding OLED, a thickness of the optical resonant cavity is positively correlated with a specific wavelength, a diameter of nanoparticles of the nanoparticle pattern is positively correlated with the specific wavelength, and the specific wavelength is a peak wavelength of a Fano resonance formed after a resonance mode of the nanoparticle pattern is coupled with a resonance mode of an optical resonant cavity of the corresponding OLED.

In some embodiments, a thickness of an optical resonant cavity of each OLED and a diameter of nanoparticles of a corresponding nanoparticle pattern are determined based on a color of light emitted by the OLED, such that light corresponding to a peak wavelength of a Fano resonance, which is formed after a resonance mode of the optical resonant cavity is coupled with a resonance mode of the corresponding nanoparticle pattern, is in the color of the light emitted by the OLED.

In some embodiments, the OLEDs are at least classified into: a first OLED capable of emitting red light, in which an optical resonant cavity has a thickness of 260 nm to 280 nm and the nanoparticle layer includes nanoparticles with a diameter of 81 nm to 91 nm; a second OLED capable of emitting green light, in which an optical resonant cavity has a thickness of 240 nm to 260 nm and the nanoparticle layer includes nanoparticles with a diameter of 65 nm to 75 nm; and a third OLED capable of emitting blue light, in which an optical resonant cavity has a thickness of 220 nm to 240 nm and the nanoparticle layer includes nanoparticles with a diameter of 25 nm to 55 nm.

In some embodiments, the dielectric film layer has a thickness of 10 nm to 20 nm.

In some embodiments, a material of the dielectric film layer includes zinc oxide or aluminum oxide.

In some embodiments, each of the plurality of nanoparticle patterns includes silver nanoparticles or gold nanoparticles, and a material of the second electrode layer includes a magnesium-aluminum alloy.

In some embodiments, the organic light emitting layer includes a first common luminescent material layer, a light emitting layer and a second common luminescent material layer, which are stacked in sequence, and each of the first common luminescent material layer and the second common luminescent material layer at least includes a carrier injection layer, a carrier blocking layer and a carrier transport layer.

In some embodiments, the organic light emitting display substrate further includes: a driving structure disposed on the base substrate and configured to drive the OLEDs to emit light.

In another aspect, the present disclosure provides a manufacturing method of an organic light emitting display substrate, including: forming a plurality of OLEDs on a base substrate, with each OLED including a first electrode layer, an organic light emitting layer and a second electrode layer, which are sequentially formed away from the base substrate, and the first electrode layer and the second electrode layer forming an optical resonant cavity; and forming a nanoparticle layer on a side of the plurality of OLEDs away from the base substrate, with the nanoparticle layer including a plurality of nanoparticle patterns, each nanoparticle pattern is disposed on a side of a second electrode layer of a corresponding one of the plurality of OLEDs away from an organic light emitting layer and at least partially covers the second electrode layer, and a resonance mode of the nanoparticle pattern is coupled with a resonance mode of an optical resonant cavity of the corresponding OLED to form a Fano resonance.

In some embodiments, after the forming the plurality of OLEDs and before the forming the nanoparticle layer, the manufacturing method further includes: forming a dielectric film layer on surfaces of the second electrode layers away from the organic light emitting layers.

In some embodiments, the forming the nanoparticle layer includes: titrating or spin coating a solvent containing a nanoparticle material onto a surface of the dielectric film layer away from the plurality of OLEDs, and performing a drying process.

In some embodiments, the dielectric film layer is formed by an atomic layer deposition process.

In still another aspect, the present disclosure provides a display panel, including the above organic light emitting display substrate.

BRIEF DESCRIPTION OF THE DRAWINGS

The drawings are used to provide a further understanding of the present disclosure, and constitute a part of the description. The drawings are intended to explain the present disclosure with the following embodiments, but do not constitute any limitation on the present disclosure. In the drawings.

DETAILED DESCRIPTION

In order to enable those skilled in the art to better understand the technical solutions of the present disclosure, the present disclosure is further described in detail below with reference to the drawings and specific embodiments.

The present disclosure is described in more detail below with reference to the drawings. Throughout the drawings, the same elements are represented by similar reference numerals. For clarity, the elements in the drawings are not drawn to scale. In addition, some well-known elements may not be shown in the drawings.

Many specific details of the present disclosure, such as structures, materials, dimensions, treatment processes and techniques of components, are described in the following description for clearer understanding of the present disclosure. However, as can be understood by those skilled in the art, the present disclosure can be implemented, regardless of those specific details.

As shown in FIGS. 1 to 8, an embodiment of the present disclosure provides an organic light emitting display substrate, including a base substrate 1 and a plurality of OLEDs disposed on the base substrate 1. Each OLED includes a first electrode layer 2, an organic light emitting layer 3 and a second electrode layer 4, which are sequentially arranged in a direction away from the base substrate 1, the first electrode layer 2 and the second electrode layer 4 form an optical resonant cavity, and at least part of the light emitted by the organic light emitting layer 3 is reflected in the optical resonant cavity for multiple times and finally passes through the second electrode layer 4. The organic light emitting display substrate further includes a nanoparticle layer which is disposed on a side of the plurality of OLEDs away from the base substrate 1 and includes a plurality of nanoparticle patterns 5, each nanoparticle pattern 5 is disposed on a side of a second electrode layer 4 of a corresponding one of the plurality of OLEDs away from an organic light emitting layer 3 and at least partially covers the second electrode layer 4, and a resonance mode of the nanoparticle pattern 5 is coupled with a resonance mode of an optical resonant cavity of the corresponding OLED to form a Fano resonance. Light extraction efficiency of the light which is emitted by the organic light emitting layer 3 and transmitted by the second electrode layer 4 can be increased through the Fano resonance.

That is to say, each of the plurality of OLEDs forms one of a plurality of pixel structures of the organic light emitting display substrate. For each OLED, the light emitted by the organic light emitting layer 3 is finally transmitted and passes through the second electrode layer 4 to realize light emission of a pixel, thereby achieving a display by the organic light emitting display substrate.

Specifically, the Fano resonance refers to a resonance response to incident (exciting) light reflected after coupling and interference of two resonance modes, a spectrum of the Fano resonance shows a typical asymmetric linear resonance, and a wavelength corresponding to a maximum peak in the spectrum is referred to as a peak wavelength of the Fano resonance. The nanoparticle pattern 5 is composed of a plurality of nanoparticles. A resonance mode formed by the nanoparticles on a side of the second electrode layer 4 is coupled with a resonance mode of a corresponding optical resonant cavity to generate a Fano resonance, which can effectively enhance near field strength of an electric field at a design waveband, thereby greatly increasing the light extraction efficiency of the optical resonant cavity.

It should be noted that, if the base substrate 1 is the lowermost layer of the organic light emitting display substrate, a light emitting side points upward and the organic light emitting display substrate is of a top emission type.

In the organic light emitting display substrate according to the embodiment of the present disclosure, the nanoparticle patterns 5 are disposed on a side of the second electrode layer 4, and the resonance mode of the nanoparticle pattern 5 can be coupled with the resonance mode of the corresponding optical resonant cavity to form the Fano resonance, so that the light extraction efficiency of the light emitted by the organic light emitting layer 3 and transmitted by the second electrode layer 4 is greatly increased, thereby improving display performance of the organic light emitting display substrate.

Figure 2:
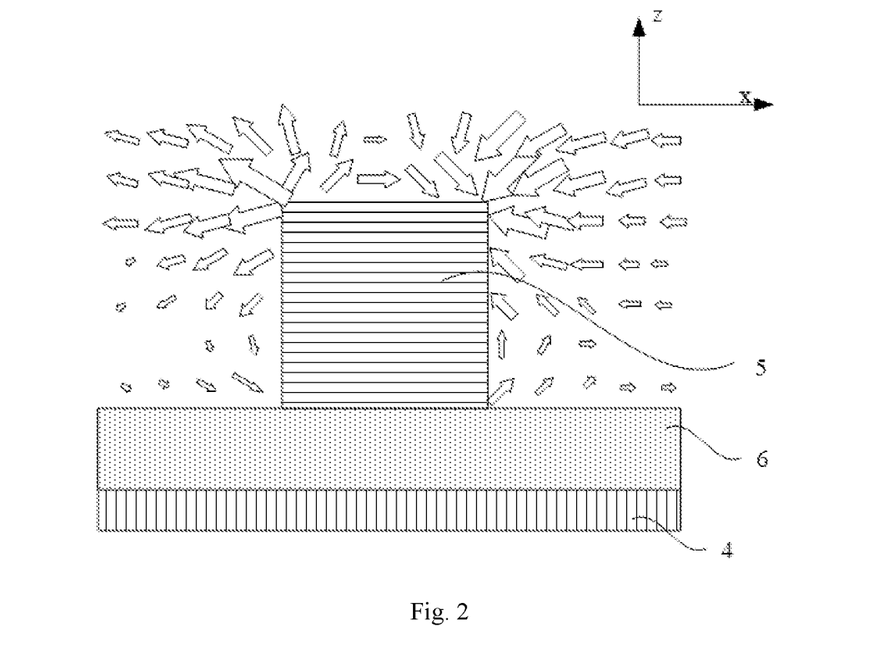
FIG. 2 is a schematic diagram illustrating enhancement of field strength of light transmitted from a light emitting layer, with the enhancement performed by a nanoparticle layer of an organic light emitting display substrate according to an embodiment of the present disclosure.

FIG. 2 shows the distribution of resonant electric fields of the nanoparticle pattern 5 and the optical resonant cavity. Arrows in FIG. 2 represent electric fields, and sizes of the arrows represent the magnitude of the electric fields. Since the magnitude of a unit electric field is defined to be 1 v/m in the simulation, the magnitude of the electric fields here also represents an enhancement factor of the electric field. As can be seen from FIG. 2, there are surface plasmon waves along a vertical side (a Z direction in FIG. 2) of a nanocube, and the strongest resonances occur at two upper corners of the nanocube, which is consistent with the optical resonant cavity in phase periodicity.

In some embodiments, the organic light emitting display substrate further includes a dielectric film layer 6 disposed between the nanoparticle layer and the second electrode layer 4. The nanoparticle layer 5 and the second electrode layer 4 form an optical nano resonant cavity for absorbing at least part of ambient light.

That is to say, a structure formed by the OLED and the dielectric film layer 6 includes the first electrode layer 2, the organic light emitting layer 3, the second electrode layer 4, the dielectric film layer 6 and the nanoparticle pattern 5, which are sequentially arranged. A light outgoing layer is disposed on a side of the nanoparticle pattern 5, and the external ambient light can also directly reach the nanoparticle pattern 5.

The nanoparticle pattern 5 is composed of a plurality of nanoparticles. Each nanoparticle in the nanoparticle pattern 5 and the second electrode layer 4 can form a miniature optical nano resonant cavity. When the ambient light reaches the nanoparticle pattern 5, a part of the ambient light can be absorbed by the optical nano resonant cavity, which reduces the glare generated by reflection of the ambient light on a display surface of the organic light emitting display substrate, thereby improving user experience.

Specifically, since the nanocube, the dielectric film layer 6 and the second electrode layer 4 form an optical nanostructure similar to a metal-dielectric-metal (MDM) structure, an incident electric field of the ambient light is converted into a strong local field in the dielectric film layer 6.

Figure 3:
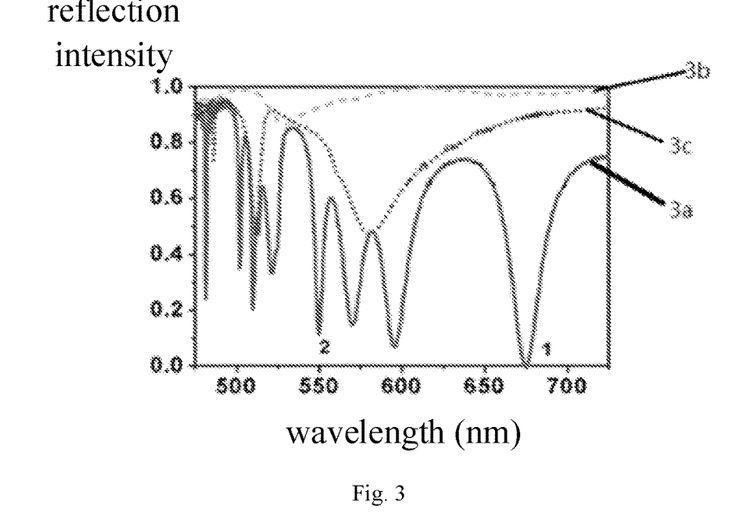
FIG. 3 is a curve diagram of illustrating influences of a dielectric film layer and a nanoparticle layer on reflection of ambient light according to an embodiment of the present disclosure.
Figure 4:
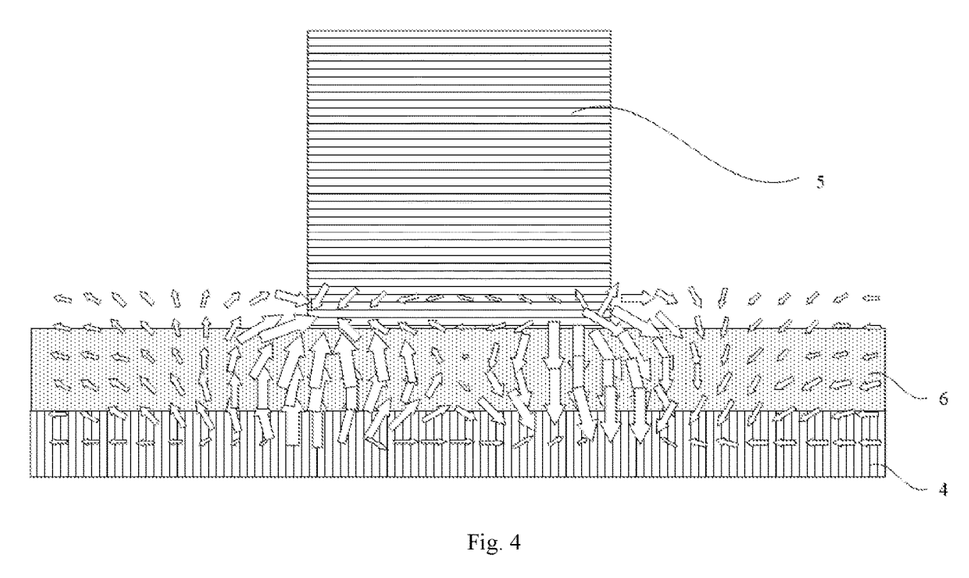
FIG. 4 is a schematic diagram illustrating field strength of ambient light absorbed by a dielectric film layer of an organic light emitting display substrate according to an embodiment of the present disclosure.

FIG. 4 shows the optical near-field distribution (corresponding to positions marked in FIG. 3) at an absorption waveband of 675 nm. As can be clearly seen from FIG. 4, the electric field strength in the dielectric film layer 6 is much stronger than that at other positions, resulting in a typical resonance mode of an optical nano resonant cavity.

In FIG. 3, a curve 3a represents a reflection spectrum of the ambient light when entering a light emitting side of the organic light emitting display substrate in a case where the optical nano resonant cavity has a thickness of 250 nm, the dielectric film layer 6 has a thickness of 20 nm, and the nanoparticles of the nanoparticle pattern 5 have a diameter of 70 nm, and it can be seen that the reflected light is strongly absorbed at many wavebands, therefore, the glare can be reduced; a curve 3b represents a reflection spectrum in the absence of the dielectric film layer 6 and the nanoparticle pattern 5, and it can be seen that most of ambient light energy of the reflected light is reflected at the light emitting side of the organic light emitting display substrate; and a curve 3c represents a reflection spectrum of the ambient light when entering the light emitting side of the organic light emitting display substrate in a case where the optical nano resonant cavity has a thickness of 250 nm, the nanoparticles of the nanoparticle pattern 5 have a diameter of 70 nm, and the dielectric film layer 6 is absent, and it can be seen that the ambient light is absorbed to certain extent, but the number of absorbable wavebands and absorption efficiency of the ambient light are far less than those of the ambient light in the case where the optical nano resonant cavity has a thickness of 250 nm, the dielectric film layer 6 has a thickness of 20 nm, and the nanoparticles of the nanoparticle pattern 5 have a diameter of 70 nm.

In addition, since the dielectric film layer 6 directly covers the second electrode layer 4, the second electrode layer 4, even the whole OLED, can be protected by the dielectric film layer 6 during a process of forming the nanoparticle pattern 5 or other subsequent packaging processes, thereby ensuring the performance of the organic light emitting display substrate.

In some embodiments, the dielectric film layer 6 has a thickness of 10 nm to 20 nm.

It should be noted that, in the embodiment, each structure of the organic light emitting display substrate is described by taking a case where the dielectric film layer 6 has a thickness of 20 nm as an example.

In some embodiments, for each nanoparticle pattern and a corresponding OLED, a thickness of the optical resonant cavity is positively correlated with a specific wavelength, a diameter of the nanoparticles of the nanoparticle pattern 5 is positively correlated with the specific wavelength, and the specific wavelength is a peak wavelength of a Fano resonance formed after a resonance mode of the nanoparticle pattern is coupled with a resonance mode of the optical resonant cavity of the corresponding OLED.

Figure 5:
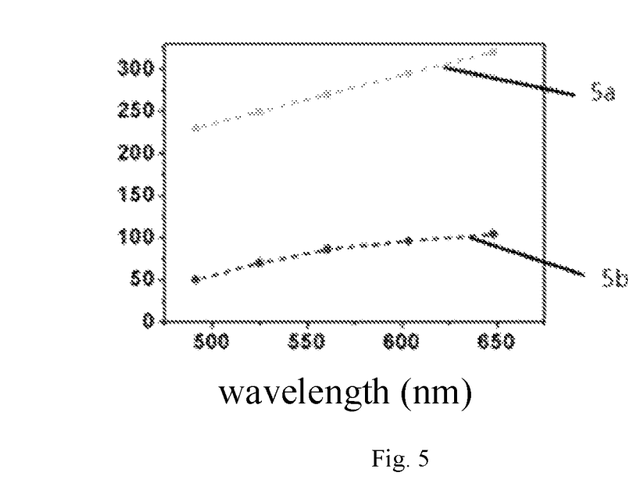
FIG. 5 is a schematic diagram of a relation curve between a thickness of an optical resonant cavity and a wavelength of strongest emitted light and a relation curve between a diameter of nanoparticles of a nanoparticle layer and the wavelength of the strongest emitted light according to an embodiment of the present disclosure.

As shown by curves in FIG. 5, there is a certain relation between a central wavelength of a Fano resonance, which is formed after a resonance mode of a nanoparticle pattern 5 is coupled with a resonance mode of a corresponding optical resonant cavity, and a thickness of the optical resonant cavity (shown by a curve 5a in FIG. 5), and a certain relation between such central wavelength and a diameter of the nanoparticles of the nanoparticle layer 5 (shown by a curve 5b in FIG. 5).

In some embodiments, a thickness of an optical resonant cavity of an OLED and a diameter of nanoparticles of a corresponding nanoparticle pattern are determined based on a color of light emitted by the OLED, such that the light corresponding to a peak wavelength of a Fano resonance, which is formed after a resonance mode of the optical resonant cavity is coupled with a resonance mode of the corresponding nanoparticle pattern, is in the color of the light emitted by the OLED.

For example, in a case where the plurality of OLEDs include an OLED which emits light of a first color, the thickness of the optical resonant cavity and the diameter of the nanoparticles can be selected and determined based on the first color and according to the relations between the thickness of the optical resonant cavity and the peak wavelength of the Fano resonance and between the diameter of the nanoparticles and the peak wavelength of the Fano resonance, such that the peak wavelength of the Fano resonance formed by the optical resonant cavity and the nanoparticles falls within a wavelength range of the light of the first color (for example, the peak wavelength of the Fano resonance is equal to a peak wavelength of the light of the first color). In this way, the light enhanced by the Fano resonance is the light of the first color.

In some embodiments, the OLEDs are at least classified into: a first OLED, in which an optical resonant cavity has a thickness of 260 nm to 280 nm, the nanoparticle layer 5 includes nanoparticles with a diameter of 81 nm to 91 nm, and an organic light emitting layer 3 can emit red light; a second OLED, in which an optical resonant cavity has a thickness of 240 nm to 260 nm, the nanoparticle layer 5 includes nanoparticles with a diameter of 65 nm to 75 nm, and an organic light emitting layer 3 can emit green light; and a third OLED, in which an optical resonant cavity has a thickness of 220 nm to 240 nm, the nanoparticle layer 5 includes nanoparticles with a diameter of 25 nm to 55 nm, and an organic light emitting layer 3 can emit blue light.

That is to say, by adjusting the thickness of the optical resonant cavity and the diameter of the nanoparticles of the nanoparticle layer 5, a resonant frequency of the nano resonant cavity of the nanoparticle layer 5 can be changed, so as to enhance the light with different wavelengths, which is transmitted by the second electrode layer 4.

Figure 6:
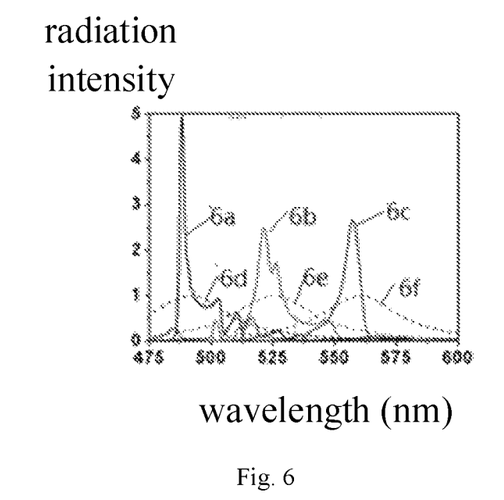
FIG. 6 is a curve diagram illustrating an influence of an optical resonant cavity alone on transmitted light, and an influence of the optical resonant cavity together with a nanoparticle layer on the transmitted light according to an embodiment of the present disclosure.

As shown in FIG. 6, each solid line (lines 6a, 6b and 6c) is a spectral curve of the light transmitted by an optical resonant cavity in the presence of a dielectric film layer 6 and a nanoparticle pattern 5, and each dotted line (lines 6d, 6e and 7f) is a spectral curve of the light transmitted by an optical resonant cavity in the absence of a dielectric film layer 6 and a nanoparticle pattern 5 (equivalent to a structure in the prior art). As can be seen from the lines 6a and 6d, when the optical resonant cavity has a thickness of 270 nm and the nanoparticle pattern 5 includes nanoparticles with a diameter of 8 6 nm, the organic light emitting layer 3 has the strongest light emission intensity at 560 nm, and the light at 560 nm is red light; as can be seen from the lines 6b and 6e, when the optical resonant cavity has a thickness of 250 nm and the nanoparticle layer 5 includes nanoparticles with a diameter of 70 nm, the organic light emitting layer 3 has the strongest light emission intensity at 525 nm, the light emission intensity at 525 nm in the presence of the dielectric film layer 6 and the nanoparticle pattern 5 is increased by about more than 2.5 times than the light emission intensity at 525 nm in the absence of the dielectric film layer 6 and the nanoparticle pattern 5, and the light at 525 nm is green light; and as can be seen from the lines 6c and 6f, when the optical resonant cavity has a thickness of 230 nm and the nanoparticle pattern 5 includes nanoparticles with a diameter of 50 nm, the organic light emitting layer 3 has the strongest light emission intensity at 490 nm, and the light at 490 nm is blue light.

It should be noted that nanoparticle patterns 5 formed from a mixture of Ag nanocubes of 25 nm, 70 nm and 104 nm can be disposed on organic light emitting layers 3 of blue pixels, green pixels and red pixels, so as to enhance emitted light with wavelengths of 460 nm, 525 nm and 650 nm. In addition, since the three kinds of nanocubes can form optical nano resonant cavities in three different sizes, visible light at more wavebands can be absorbed, thereby producing a better glare reduction effect. After the particles are mixed, an optimum total areal density for coating the three kinds of particles needs to be maintained at 15 particles/$\mu m^2$ to 30 particles/$\mu m^2$.

Figure 7:
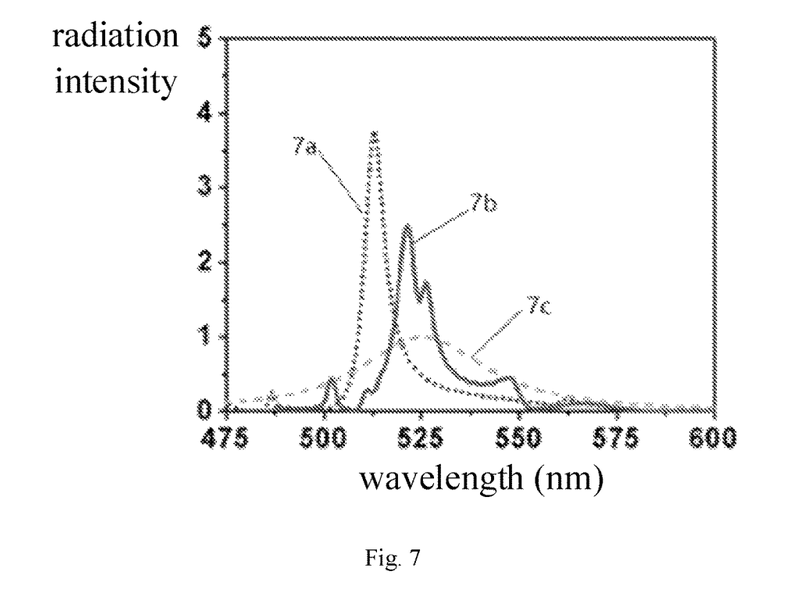
FIG. 7 is a curve diagram illustrating an influence of an optical resonant cavity alone on transmitted light, an influence of the optical resonant cavity and a nanoparticle layer without a dielectric film layer on the transmitted light, and an influence of the optical resonant cavity together with the dielectric film layer and the nanoparticle layer on the transmitted light according to an embodiment of the present disclosure.

In addition, as shown in FIG. 7, if the organic light emitting display substrate is only provided with the nanoparticle pattern 5 and is not provided with the dielectric film layer 6, a strong Fano resonance can also be formed, and emitted light can also be enhanced, as shown by a curve 7a (a curve 7b illustrates a case where both the nanoparticle pattern 5 and the dielectric film layer 6 are provided, and a curve 7c illustrates a case where none of the nanoparticle layer 5 and the dielectric film layer 6 is provided). However, such structure does not have a strong capability to absorb ambient light due to a lack of an optical nano resonant cavity.

In some embodiments, the nanoparticle pattern 5 includes Ag nanoparticles or Au nanoparticles. In some embodiments, a material of the dielectric film layer 6 includes zinc oxide (ZnO) or aluminum oxide ($Al_2O_3$). In some embodiments, a material of the second electrode layer 4 includes a magnesium-aluminum (Mg—Al) alloy.

Specifically, the second electrode layer 4 may be a cathode layer. In some embodiments, the cathode layer is made from the Mg—Al alloy with a mass ratio of 1:10, and the first electrode layer 2 is an anode layer.

It should be note that the nanoparticle pattern 5, the dielectric film layer 6 and the second electrode layer 4 may be made from other suitable materials, which are not listed one by one here.

Figure 1:
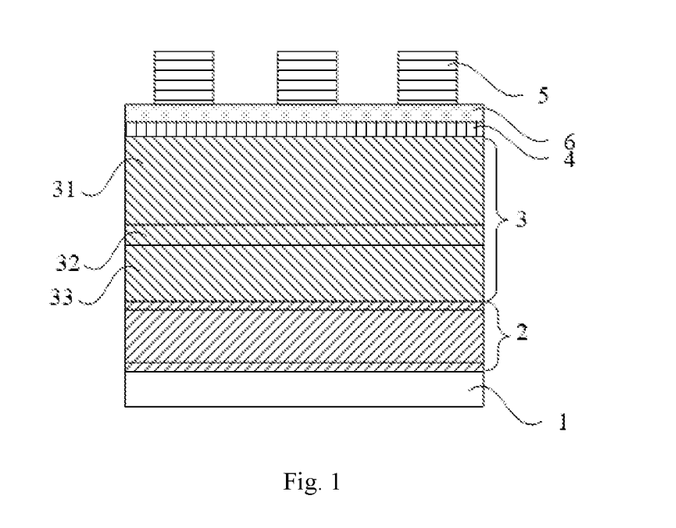
FIG. 1 is a schematic structural diagram of an organic light emitting display substrate according to an embodiment of the present disclosure.

In addition, as shown in FIG. 1, the first electrode layer 2 (the anode layer) of the OLED is formed by laminating three layers of indium tin oxide, silver and indium tin oxide (ITO/Ag/ITO).

In some embodiments, the organic light emitting layer 3 includes a first common luminescent material layer 31, a light emitting layer 32, and a second common luminescent material layer 33, which are stacked in sequence. Each of the first common luminescent material layer 31 and the second common luminescent material layer 33 at least includes a carrier injection layer, a carrier blocking layer, and a carrier transport layer.

The organic light emitting layer 3 may be made from an organic electroluminescent material used in the existing art.

In some embodiments, the organic light emitting display substrate further includes a driving structure disposed on the base substrate 1 and configured to drive the OLEDs to emit light.

Figure 8:
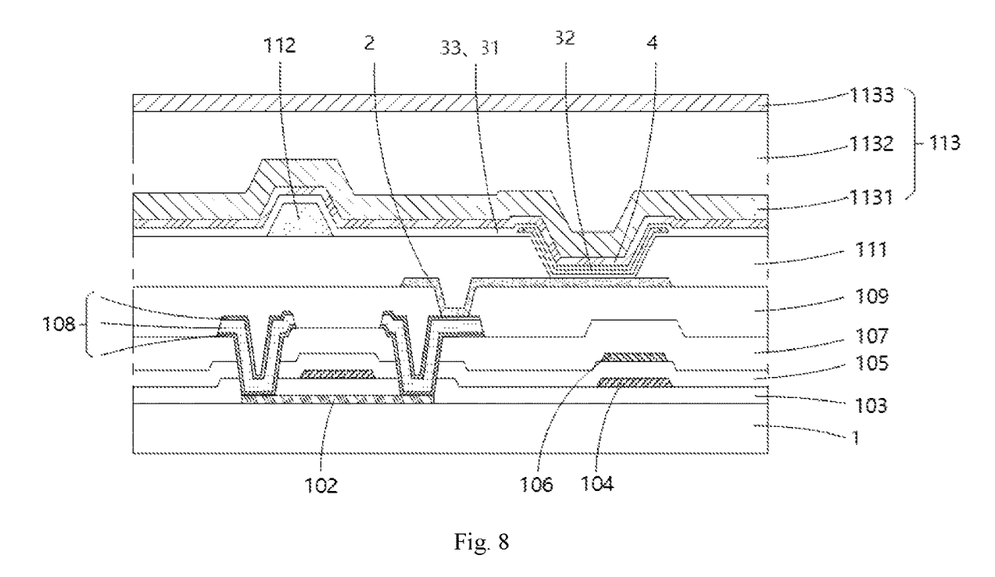
FIG. 8 is a schematic structural diagram of an organic light emitting display substrate according to an embodiment of the present disclosure.

Specifically, as shown in FIG. 8, the driving structure includes a channel material layer 102, a first gate dielectric layer 103, a first gate 104, a second gate dielectric layer 105, a second gate 106, an insulating dielectric layer 107, and a source/drain 108. The source/drain 108 is formed by a three-layer metal film, such as a titanium-aluminum-titanium (Ti/Al/Ti) film, and such a laminated structure can ensure that upper and lower surfaces are not easily oxidized on the premise of ensuring good conductivity of the source/drain. A planarization layer 109 covers the driving structure, performs functions of planarization and electrical insulation for subsequent processes, and is made of an organic material.

The OLED is manufactured on the planarization layer 109, and the first electrode layer 2 (the anode layer) of the OLED is electrically coupled to a drive circuit via an opening in the planarization layer 109. The second electrode layer 4 (i.e., the cathode layer CTD) of the OLED covers the organic light emitting layer 3 and is coupled to an external power supply via a bridge around a screen. A pixel definition layer 111 defines an area where the organic light emitting layer 3 is in contact with the anode layer, that is, an actual light emission area. An isolation pillar 112 is manufactured on the pixel definition layer 111, and plays a supporting role in evaporation of an organic material using a high-definition metal mask.

A thin film packaging layer 113 at least includes one inorganic material layer and one organic material layer. As shown in FIG. 8, the thin film packaging layer is composed of a first inorganic packaging layer 1131, an organic packaging layer 1132 and a second inorganic packaging layer 1133. The inorganic packaging layers mainly play a role in blocking water and oxygen, and the organic layer mainly plays a role in planarization and stress release in a display region. A boundary of the inorganic packaging layer should wrap a boundary of the organic packaging layer, so as to prevent water and oxygen from penetrating through sides.

In another aspect, the present disclosure provides a manufacturing method of the above organic light emitting display substrate. The manufacturing method includes: forming a plurality of OLEDs on a base substrate 1, with each OLED including a first electrode layer 2, an organic light emitting layer 3 and a second electrode layer 4, which are sequentially formed away from the base substrate 1, and the first electrode layer 2 and the second electrode layer 4 forming an optical resonant cavity; and forming a nanoparticle layer on a side of the plurality of OLEDs away from the base substrate 1, with the nanoparticle layer including a plurality of nanoparticle patterns 5, each nanoparticle pattern 5 is disposed on a side of a second electrode layer 4 of a corresponding one of the plurality of OLEDs away from an organic light emitting layer 3 and at least partially covers the second electrode layer 4, and a resonance mode of the nanoparticle pattern 5 is coupled with a resonance mode of an optical resonant cavity of the corresponding OLED to form a Fano resonance.

At least part of the light emitted by the organic light emitting layer 3 is reflected in the optical resonant cavity for multiple times and is finally transmitted by the second electrode layer 4.

In some embodiments, after the step of forming the plurality of OLEDs and before the step of forming the nanoparticle layer, the manufacturing method further includes: forming a dielectric film layer 6 on surfaces of the second electrode layers 4 away from the organic light emitting layers 3.

Specifically, a ZnO layer or an $Al_2O_3$ layer with a thickness of 10 nm to 20 nm may be deposited on the second electrode layers 4 (the cathode layers) by means of atomic layer deposition to form the dielectric film layer 6.

The resonance mode of the nanoparticle layer 5 is coupled with the resonance mode of the corresponding optical resonant cavity, so as to increase the light extraction efficiency of the light which is emitted by the organic light emitting layer 3 and transmitted by the second electrode layer 4.

Specifically, before the step of forming the nanoparticle layer 5, the manufacturing method further includes: preparing a solvent containing a nanoparticle material.

A size of the nanoparticle material may be adjusted according to a chemical reaction method. For example, if the nanoparticle material is Ag nanocubes, a double-hydrophobic solvent method can be adopted, that is, silver nitrate is used as an Ag precursor, dioctyl ether and oleylamine are used as double solvents, Dioctadecyl Dimethyl Ammonium Chloride (DDAC) is used as a surfactant, the nanoparticle material is prepared with a high-temperature injection method, and the obtained Ag nanocubes are stored in an n-hexane solvent.

The step of forming the nanoparticle layer includes: titrating or spin coating the solvent containing the nanoparticle material onto a surface of the dielectric film layer 6 away from the second electrode layers 4, and performing a drying process.

Specifically, the n-hexane solvent containing the Ag nanocubes is subjected to ultrasonic processing for 10 minutes, a proper amount of the solvent is selected and titrated or spin coated onto the dielectric film layer 6, and then the n-hexane solvent is removed through a rapid drying process. The coating process needs to be performed in an environment of an inert gas, such as nitrogen ($N_2$), and an areal density for coating particles is maintained at 10 particles/$\mu m^2$ to 100 particles/$\mu m^2$ In the manufacturing method of the organic light emitting display substrate according to the embodiment of the present disclosure, the nanoparticle layer is disposed on a side of the second electrode layer 4, and the resonance mode of the nanoparticle layer and the resonance mode of the corresponding optical resonant cavity can be coupled with each other to form the Fano resonance, so that the light extraction efficiency of the light emitted by the organic light emitting layer 3 and transmitted by the second electrode layer 4 is greatly increased, thereby improving the display performance of the organic light emitting display substrate.

In still another aspect, an embodiment of the present disclosure provides a display panel, including the above organic light emitting display substrate.

Specifically, the display panel can be applied to any product or component having a display function, such as an OLED display device, an OLED device, an OLED lighting device, electronic paper, a mobile phone, a tablet computer, a television, a monitor, a notebook computer, a digital photo frame and a navigator.

It should be noted that the relational terms, such as "first" and "second", are used herein merely to distinguish one entity or operation from another entity or operation, and do not necessarily require or imply that those entities or operations have any actual relation or in any actual order. Furthermore, the terms "comprise", "include" or any other variation thereof are intended to indicate a non-exclusive inclusion, so that a process, method, article or device that includes a series of elements not only includes those elements, but also includes other elements not explicitly listed, or inherent elements thereto. If not limited otherwise, an element after "include a . . . " does not exclude the presence of other identical elements in a process, method, article or device including the element.

The embodiments of the present disclosure described above do not describe all details thoroughly, and are not intended to limit the present disclosure. It is obvious that many modifications and variations can be made according to the above description. The embodiments are chosen and described in detail for better explaining the principles and practical applications of the present disclosure, so as to enable those skilled in the art to better implement the present disclosure and make various modifications based on the present disclosure. The present disclosure is limited only by the claims and the full scope thereof, and its equivalents.

What is claimed is:

1. An organic light emitting display substrate, comprising:
a base substrate;
a plurality of organic light emitting diodes on the base substrate, each organic light emitting diode comprising a first electrode layer, an organic light emitting layer and a second electrode layer which are sequentially arranged in a direction away from the base substrate, and the first electrode layer and the second electrode layer forming an optical resonant cavity; and
a nanoparticle layer on a side of the plurality of organic light emitting diodes away from the base substrate and comprising a plurality of nanoparticle patterns, each nanoparticle pattern being on a side of a second electrode layer of a corresponding one of the plurality of organic light emitting diodes away from an organic light emitting layer and at least partially covering the second electrode layer, and a resonance mode of the nanoparticle pattern being coupled with a resonance mode of an optical resonant cavity of the corresponding organic light emitting diode to form a Fano resonance.

2. The organic light emitting display substrate of claim 1, further comprising:
a dielectric film layer between the nanoparticle layer and the second electrode layers of the plurality of organic light emitting diodes, so as to allow the nanoparticle layer and the second electrode layers to form optical nano resonant cavities for absorbing at least part of ambient light.

3. The organic light emitting display substrate of claim 2, wherein for each nanoparticle pattern and a corresponding organic light emitting diode, a thickness of the optical resonant cavity is positively correlated with a specific wavelength, a diameter of nanoparticles of the nanoparticle pattern is positively correlated with the specific wavelength, and the specific wavelength is a peak wavelength of a Fano resonance formed after a resonance mode of the nanoparticle pattern is coupled with a resonance mode of an optical resonant cavity of the corresponding organic light emitting diode.

4. A display panel, comprising the organic light emitting display substrate of claim 3.

5. The organic light emitting display substrate of claim 2, wherein the dielectric film layer has a thickness of 10 nm to 20 nm.

6. A display panel, comprising the organic light emitting display substrate of claim 5.

7. The organic light emitting display substrate of claim 2, wherein a material of the dielectric film layer comprises zinc oxide or aluminum oxide.

8. A display panel, comprising the organic light emitting display substrate of claim 7.

9. A display panel, comprising the organic light emitting display substrate of claim 2.

10. The organic light emitting display substrate of claim 1, wherein a thickness of an optical resonant cavity of an organic light emitting diode and a diameter of nanoparticles of a corresponding nanoparticle pattern are determined based on a color of light emitted by the organic light emitting diode, such that light corresponding to a peak wavelength of a Fano resonance, which is formed after a resonance mode of the optical resonant cavity is coupled with a resonance mode of the corresponding nanoparticle pattern, is in the color of the light emitted by the organic light emitting diode.

11. The organic light emitting display substrate of claim 10, wherein the organic light emitting diodes are at least classified into:
a first organic light emitting diode, an optical resonant cavity of the first organic light emitting diode having a thickness of 260 nm to 280 nm, the nanoparticle layer comprising nanoparticles with a diameter of 81 nm to 91 nm, and the first organic light emitting diode being capable of emitting red light;
a second organic light emitting diode, an optical resonant cavity of the second organic light emitting diode having a thickness of 240 nm to 260 nm, the nanoparticle layer comprising nanoparticles with a diameter of 65 nm to 75 nm, and the second organic light emitting diode being capable of emitting green light; and
a third organic light emitting diode, an optical resonant cavity of the third organic light emitting diode having a thickness of 220 nm to 240 nm, the nanoparticle layer comprising nanoparticles with a diameter of 25 nm to 55 nm, and the third organic light emitting diode is capable of emitting blue light.

12. A display panel, comprising the organic light emitting display substrate of claim 11.

13. A display panel, comprising the organic light emitting display substrate of claim 10.

14. The organic light emitting display substrate of claim 1, wherein each of the plurality of nanoparticle patterns comprises silver nanoparticles or gold nanoparticles, and a material of the second electrode layer comprises a magnesium-aluminum alloy.

15. The organic light emitting display substrate of claim 1, wherein the organic light emitting layer comprises a first common luminescent material layer, a light emitting layer and a second common luminescent material layer, which are stacked in sequence, and each of the first common luminescent material layer and the second common luminescent material layer at least comprises a carrier injection layer, a carrier blocking layer and a carrier transport layer.

16. A display panel, comprising the organic light emitting display substrate of claim 1.

17. A manufacturing method of an organic light emitting display substrate, comprising:
forming a plurality of organic light emitting diodes on a base substrate, where each organic light emitting diode comprises a first electrode layer, an organic light emitting layer and a second electrode layer sequentially formed away from the base substrate, and the first electrode layer and the second electrode layer form an optical resonant cavity; and
forming a nanoparticle layer on a side of the plurality of organic light emitting diodes away from the base substrate, the nanoparticle layer comprising a plurality of nanoparticle patterns, each nanoparticle pattern being on a side of a second electrode layer of a corresponding one of the plurality of organic light emitting diodes away from an organic light emitting layer and at least partially covering the second electrode layer, and a resonance mode of the nanoparticle pattern being coupled with a resonance mode of an optical resonant cavity of the corresponding organic light emitting diode to form a Fano resonance.

18. The manufacturing method of an organic light emitting display substrate of claim 17, after the forming the plurality of organic light emitting diodes and before the forming the nanoparticle layer, further comprising:
forming a dielectric film layer on surfaces of the second electrode layers away from the organic light emitting layers.

19. The manufacturing method of an organic light emitting display substrate of claim 18, wherein the forming the nanoparticle layer comprises:
titrating or spin coating a solvent containing a nanoparticle material onto a surface of the dielectric film layer away from the plurality of organic light emitting diodes, and performing a drying process.

20. The manufacturing method of an organic light emitting display substrate of claim 18, wherein the dielectric film layer is formed by an atomic layer deposition process.

* * * * *